United States Patent
Ferullo

(10) Patent No.: US 11,229,120 B1
(45) Date of Patent: Jan. 18, 2022

(54) APPARATUS, SYSTEM, AND METHOD FOR RETAINING THERMAL INTERFACE MATERIAL BETWEEN ELECTRICAL COMPONENTS AND HEATSINKS

(71) Applicant: Juniper Networks, Inc., Sunnyvale, CA (US)

(72) Inventor: John Ferullo, Sunnyvale, CA (US)

(73) Assignee: Juniper Networks, Inc, Sunnyvale, CA (US)

( * ) Notice: Subject to any disclaimer, the term of this patent is extended or adjusted under 35 U.S.C. 154(b) by 98 days.

(21) Appl. No.: 16/824,517

(22) Filed: Mar. 19, 2020

(51) Int. Cl.
*H05K 9/00* (2006.01)
*H05K 1/18* (2006.01)

(52) U.S. Cl.
CPC ... *H05K 1/181* (2013.01); *H05K 2201/10227* (2013.01)

(58) Field of Classification Search
CPC ........... H05K 1/181; H05K 9/0022; H05K 9/0024–0032; H05K 9/0045; H05K 9/0052; H05K 2201/0707; H05K 2201/10371
See application file for complete search history.

(56) References Cited

U.S. PATENT DOCUMENTS

| | | | | |
|---|---|---|---|---|
| 2002/0185294 A1* | 12/2002 | Shlyakhtichman | .. | H05K 9/0032 174/384 |
| 2004/0057198 A1* | 3/2004 | Kahl | .................... | H05K 9/0015 361/679.01 |
| 2013/0235528 A1* | 9/2013 | Lee | ....................... | H05K 9/0032 361/704 |
| 2014/0313688 A1* | 10/2014 | Colahan | .............. | B29C 45/1671 361/818 |
| 2020/0152581 A1* | 5/2020 | Kumura | ............... | H05K 9/0024 |

* cited by examiner

*Primary Examiner* — Hoa C Nguyen
(74) *Attorney, Agent, or Firm* — FisherBroyles, LLP

(57) ABSTRACT

The disclosed interference-fit frame includes (1) a border dimensioned for installation around an electrical component coupled to a circuit board, wherein (A) the border forms an opening in which the electrical component resides when the border is installed and (B) at least a portion of the border constitutes a retention dam that rises beyond the electrical component when the border is installed, and (2) at least one protuberance that extends from the border into the opening. Various other apparatuses, systems, and methods are also disclosed.

18 Claims, 9 Drawing Sheets

APPARATUS, SYSTEM, AND METHOD FOR RETAINING THERMAL INTERFACE MATERIAL BETWEEN ELECTRICAL COMPONENTS AND HEATSINKS

BACKGROUND

Thermal Interface Material (TIM) is often applied between electrical components and heatsinks to enhance and/or increase the corresponding thermal coupling or heat transfer capabilities. In some examples, TIM may serve to fill gaps caused by manufacturing and/or design tolerances between electrical components and heatsinks. Unfortunately, portions of TIM may shift, move, and/or migrate off the electrical components and/or heatsinks due to certain vibrations, movements, and/or drops. As a result, the thermal coupling between the electrical components and heatsinks may be severely impaired, thereby potentially limiting the performance of such electrical components.

The instant disclosure, therefore, identifies and addresses a need for additional and improved apparatuses, systems, and methods for retaining TIM between electrical components and heatsinks.

SUMMARY

As will be described in greater detail below, the instant disclosure generally relates to apparatuses, systems, and methods for retaining TIM between electrical components and heatsinks. In one example, an interference-fit frame for accomplishing such a task may include (1) a border dimensioned for installation around an electrical component coupled to a circuit board, wherein (A) the border forms an opening in which the electrical component resides when the border is installed and (B) at least a portion of the border constitutes a retention dam that rises beyond the electrical component when the border is installed, and (2) at least one protuberance that extends from the border into the opening.

Similarly, a system for accomplishing such a task may include (1) an electrical component coupled to a circuit board and (2) an interference-fit frame comprising (A) a border dimensioned for installation around an electrical component coupled to a circuit board, wherein (1) the border forms an opening in which the electrical component resides when the border is installed and (11) at least a portion of the border constitutes a retention dam that rises beyond the electrical component when the border is installed, and (B) at least one protuberance that extends from the border into the opening.

A corresponding method may include (1) manufacturing an interference-fit frame that includes (A) a border that forms an opening and (B) at least one protuberance that extends from the border into the opening and then (2) installing the interference-fit frame around an electrical component coupled to a circuit board such that at least a portion of the border rises beyond the electrical component to facilitate retaining TIM between the electrical component and a heatsink.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
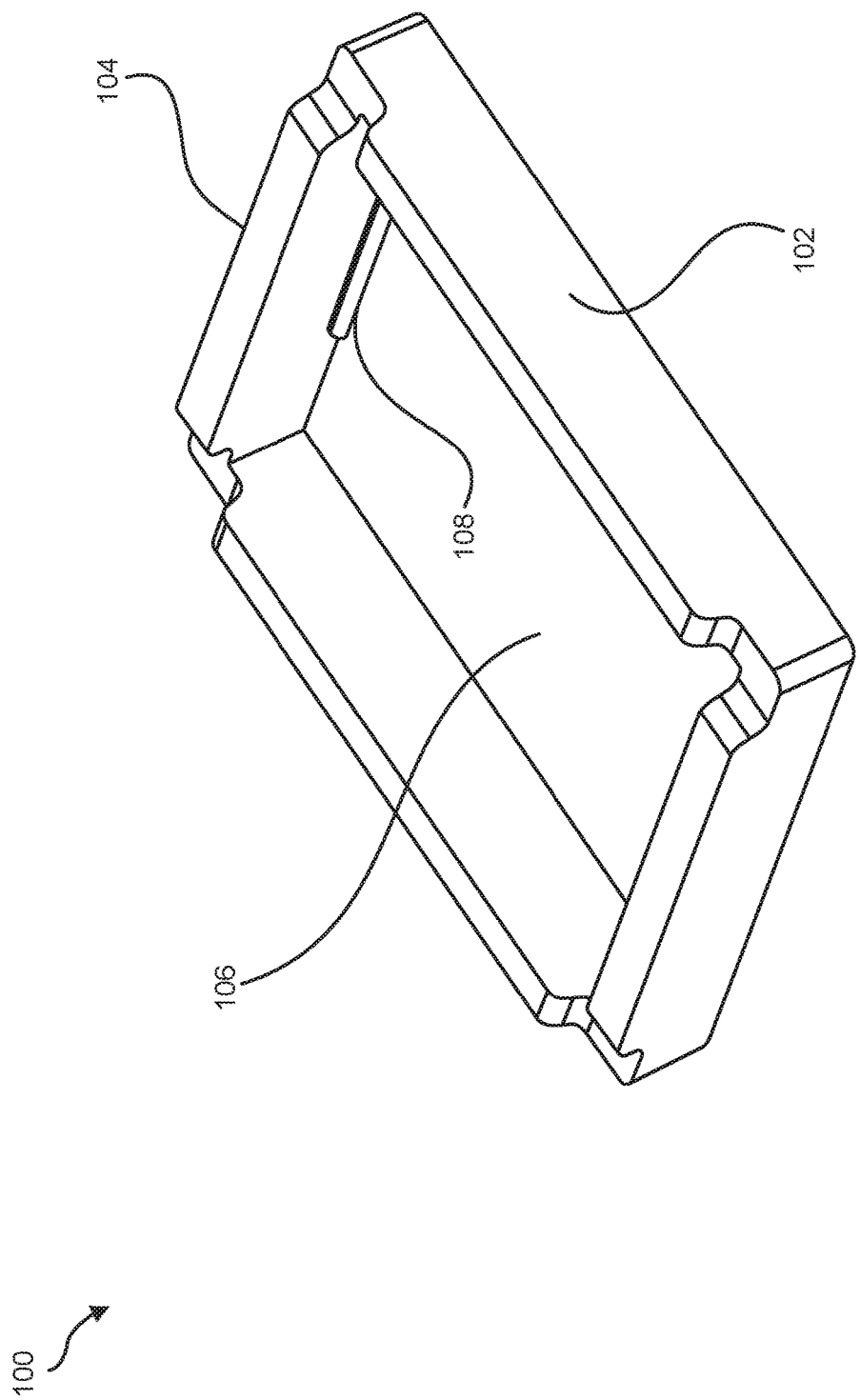
FIG. 1 is an illustration of an exemplary interference-fit frame for retaining TIM between electrical components and heatsinks.

Throughout the drawings, identical reference characters and descriptions indicate similar, but not necessarily identical, elements. While the exemplary embodiments described herein are susceptible to various modifications and alternative forms, specific embodiments have been shown byway of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for retaining TIM between electrical components and heatsinks. As will be explained in greater detail below, embodiments of the instant disclosure may involve and/or constitute an interference-fit frame intended and/or designed to retain TIM between an electrical component (such as an integrated circuit) and a heatsink. By doing so, the interference-fit frame may be able to enhance and/or increase the corresponding thermal coupling and/or heat transfer capabilities by ensuring that the TIM remains within any potential gap between the electrical component and heatsink. In other words, the interference-fit frame may prevent the TIM from shifting, moving, and/or migrating off the electrical component and/or heatsink due to certain vibrations, movements, and/or drops. As a result, the thermal coupling between the electrical component and heatsink may remain strong and/or intact, thereby potentially enabling the electrical component to achieve and/or reach its optimal performance.

In one example, this interference-fit frame may include and/or represent a border dimensioned for installation around an electrical component coupled to a circuit board. In this example, the border may include and/or form an opening in which the electrical component resides when the boarder is installed. At least a portion of the border may include and/or represent a retention dam and/or fence that rises above the electrical component when the boarder is installed. The interference-fit frame may also include and/or represent a protuberance that extends from the border into the opening.

The following will provide, with reference to FIG. 1-8, detailed descriptions of an exemplary apparatuses, systems, configurations, and/or implementations for retaining TIM between electrical components and heatsinks. In addition, the discussion corresponding to FIG. 9 will provide a detailed description of an exemplary method for retaining TIM between electrical components and heatsinks.

Figure 2:
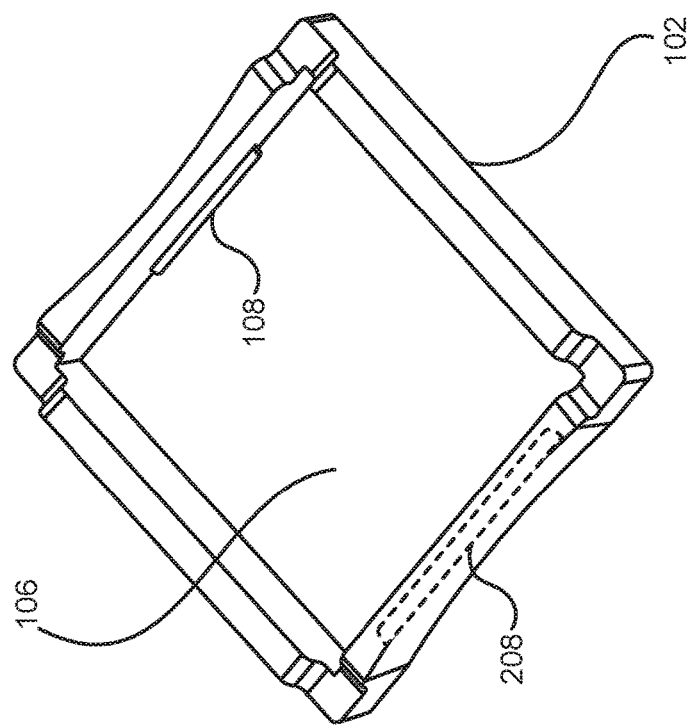
FIG. 2 is an illustration of an exemplary interference-fit frame for retaining TIM between electrical components and heatsinks.

FIGS. 1 and 2 illustrates an exemplary interference-fit frame 100 for retaining TIM between electrical components and heatsinks. As illustrated in FIGS. 1 and 2, exemplary interference-fit frame 100 may include and/or represent a border 102 dimensioned for installation around an electrical component coupled to a circuit board. In one example, border 102 may form an opening 106 in which the electrical component resides when border 102 is installed. In this example, at least a portion of border 102 may constitute and/or represent a retention dam 104 that rises beyond the electrical component when border 102 is installed. Interference-fit frame 100 may also include and/or represent at least one protuberance 108 that extends from border 102 into opening 106.

In some examples, border 102 may include and/or represent a structure, frame, and/or boundary that is mounted and/or installed around the electrical component. In such examples, border 102 may be intended and/or designed to retain, contain, and/or maintain TIM between the electrical component and a heatsink. In one example, the electrical component and heatsink may essentially sandwich the TIM such that the TIM forms a thermal bridge and/or coupling between the electrical component and the heatsink. By doing so, the TIM may enable the heatsink to conduct, absorb, and/or dissipate heat generated and/or emitted by the electrical component. Accordingly, the TIM may effectively transfer and/or carry heat generated and/or emitted by the electrical component across any gap that might exist between the electrical component and heatsink due to manufacturing and/or design tolerances.

Border 102 may be of various shapes and/or dimensions. In some examples, border 102 may form any shape that conforms to and/or is consistent with the shape of the electrical component. For example, border 102 may include and/or represent a square, rectangle, and/or cuboid. Additional examples of potential shapes formed by border 102 include, without limitation, ovals, circles, rings, triangles, pentagons, hexagons, polygons, variations or combinations of one or more of the same, and/or any other suitable shapes.

In some examples, border 102 may be sized in a particular way to retain, contain, and/or maintain the TIM between the electrical component and heatsink. For example, border 102 may be sized to hug and/or fit tightly or snuggly around the electrical component. Additionally or alternatively, border 102 may be sized to provide and/or support a bit of tolerance or space between border 102 and the electrical component.

Border 102 may include and/or contain any of a variety of materials. In one example, border 102 may include and/or contain one or more plastics and/or injection molding materials. Additional examples of such materials include, without limitation, metals, foams, ceramics, polymers, composites, variations or combinations of one or more of the same, and/or any other suitable materials.

In some examples, border 102 may include and/or represent a single part and/or unit. For example, border 102 may constitute and/or represent a single piece of injection molding or foam. In other examples, border 102 may include and/or represent an assembly of discrete parts or units. For example, a set of discrete parts or units may be coupled together by an attachment mechanism to form border 102. Examples of such attachment mechanisms include, without limitation, adhesives (e.g., silicones, glues, and/or tapes), sticky surfaces, fasteners, press-fit fastenings, magnetic fasteners, locks, pins, screws, joints, clamps, clasps, variations or combinations of one or more of the same, and/or any other suitable attachment mechanisms.

In some examples, retention dam 104 may include and/or represent a fence or fencing that rises and/or extends to a certain level as part of border 102. For example, to retain TIM between a specific type of electrical component and its corresponding heatsink, retention dam 104 of border 102 may be designed and/or configured to rise and/or extend beyond the height of the electrical component. In other words, the height of retention dam 104 may be constructed to exceed the height of the intended electrical component in order to ensure that the TIM remains between the intended electrical component and does not leak out between border 102 and the heatsink.

In some examples, retention dam 104 may be sized to reach and/or extend all the way to the heatsink. As a result, once the heatsink is installed atop the electrical component, the heatsink may be positioned and/or installed flush against retention dam 104. Or put differently, retention dam 104 may be positioned and/or installed flush against the heatsink. In other examples, retention dam 104 may be sized to extend above the electrical component but below the heatsink.

In some examples, protuberance 108 may include and/or represent a member, peg, and/or part that protrudes, projects, and/or juts out from border 102. In one example, protuberance 108 may be intended and/or designed to place or provide tension and/or friction on the electrical component. By doing so, protuberance 108 may be able to secure border 102 to the electrical component by way of an interference fit, a tension fit, a press fit, and/or a slip fit.

Protuberance 108 may be of various shapes and/or dimensions. For example, protuberance 108 may include and/or represent a square, rectangle, and/or cuboid. Additional examples of potential shapes formed by protuberance 108 include, without limitation, ovals, circles, rings, triangles, pentagons, hexagons, polygons, variations or combinations of one or more of the same, and/or any other suitable shapes.

In some examples, protuberance 108 may be sized in a particular way to secure border 102 to the electrical component. For example, protuberance 108 may be sized to ensure that a certain amount of surface area interfaces and/or makes contact with the electrical component. Additionally or alternatively, protuberance 108 may essentially close any gap or tolerance between border 102 and the electrical component.

Protuberance 108 may include and/or contain any of a variety of materials. In one example, protuberance 108 may include and/or contain one or more plastics and/or injection molding materials. Additional examples of such materials include, without limitation, metals, foams, ceramics, polymers, composites, variations or combinations of one or more of the same, and/or any other suitable materials.

In some examples, border 102 and protuberance 108 may together represent and/or be formed as a single part and/or unit. For example, border 102 and protuberance 108 may constitute and/or represent a single piece of injection molding or foam. In other examples, border 102 and protuberance 108 may include and/or represent an assembly of discrete parts or units. For example, protuberance 108 may be coupled to border 102 by an attachment mechanism (including, e.g., any of those listed above in connection with border 102).

Although FIGS. 1 and 2 illustrate a single instance of protuberance 108, other embodiments of interference-fit frames may include and/or incorporate various protuberances. For example, interference-fit frame 100 may include and/or incorporate two protuberances that are positioned on opposing sides of border 102. In another example, interference-fit frame 100 may include and/or incorporate the same number of protuberances as the number of sides on border 102. In this example, interference-fit frame 100 may include and/or incorporate a protuberance on each of those sides of border 102.

In some examples, interference-fit frame 100 may include one or more flex features that enable border 102 to flexibly mount around the electrical component. For example, border 102 may include and/or incorporate at least one pocket of empty space 208 formed within at least one of the sides. In this example, pocket of empty space 208 may enable border 102 to flex, bend, and/or arch to fit or conform to the electrical component.

Although FIG. 2 illustrates a single instance of pocket of empty space 208, other embodiments of interference-fit frames may include and/or incorporate various pockets of empty space. For example, interference-fit frame 100 may include and/or incorporate two pockets of empty space that are positioned on opposing sides of border 102. In another example, interference-fit frame 100 may include and/or incorporate the same number of pockets as the number of sides on border 102. In this example, interference-fit frame 100 may include and/or incorporate a pocket on each of those sides of border 102.

Figure 3:
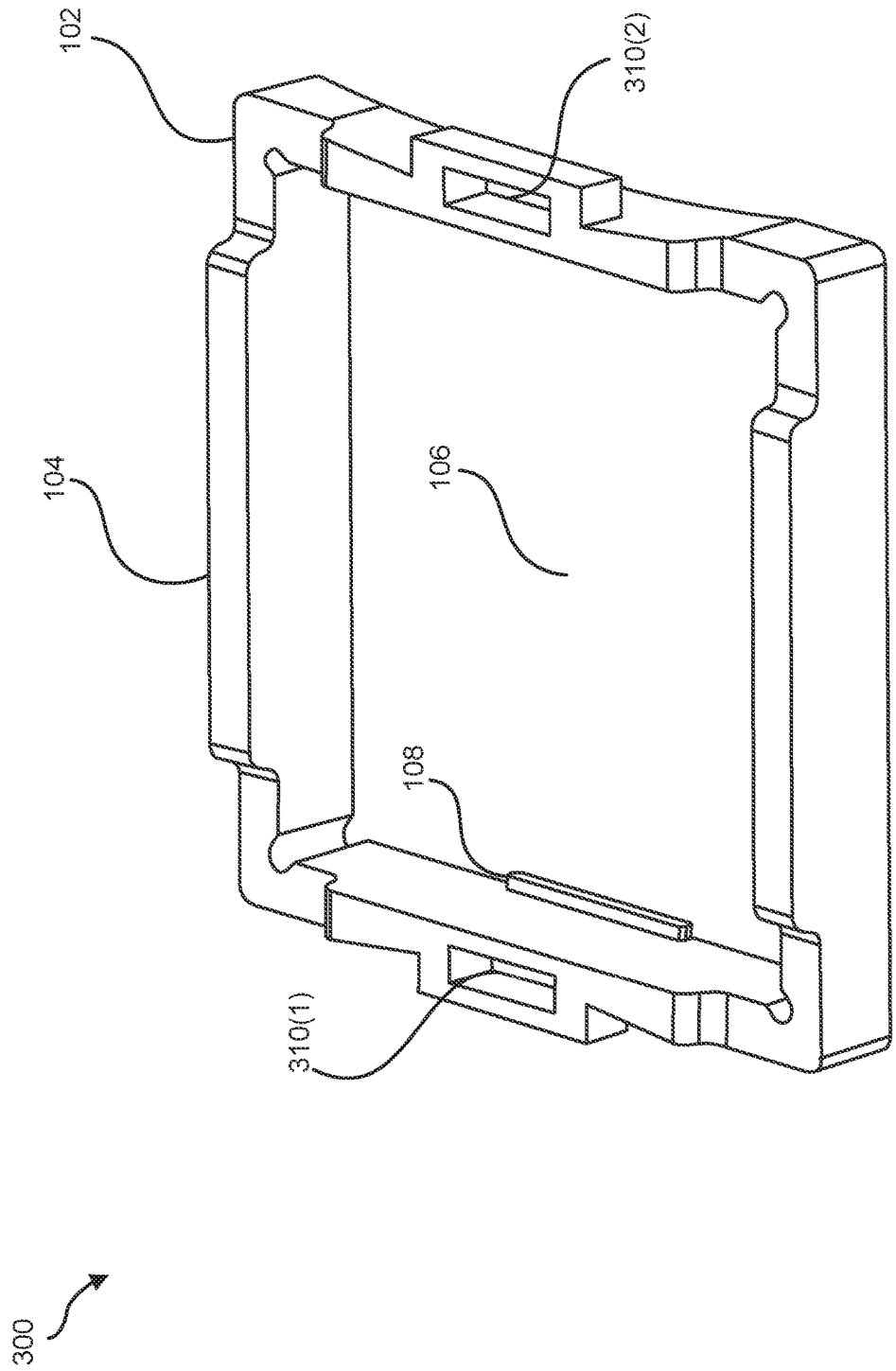
FIG. 3 is an illustration of an additional exemplary interference-fit frame for retaining TIM between electrical components and heatsinks.

FIG. 3 illustrates an exemplary interference-fit frame 300 for retaining TIM between electrical components and heatsinks. As illustrated in FIG. 3, exemplary interference-fit frame 300 may include and/or represent a border 102 dimensioned for installation around an electrical component coupled to a circuit board. In one example, border 102 may form an opening 106 in which the electrical component resides when border 102 is installed. In this example, at least a portion of border 102 may constitute and/or represent a retention dam 104 that rises beyond the electrical component when border 102 is installed. Interference-fit frame 300 may also include and/or represent at least one protuberance 108 that extends from border 102 into opening 106.

As illustrated in FIG. 3, interference-fit frame 300 may include one or more trenches dimensioned to accept a tool for uninstalling border 102 from the electrical component. For example, border 102 may include and/or represent four sides. In this example, two of those opposing sides may form and/or incorporate trenches 310(1) and 310(2). In one embodiment, trenches 310(1) and 310(2) may enable a technician to remove and/or pop off interference-fit frame 300 from the electrical component and/or circuit board. Examples of trenches 310(1) and 310(2) include, without limitation, indentations, depressions, openings, holes, variations or combinations of one or more of the same, and/or any other suitable trenches.

Figure 4:
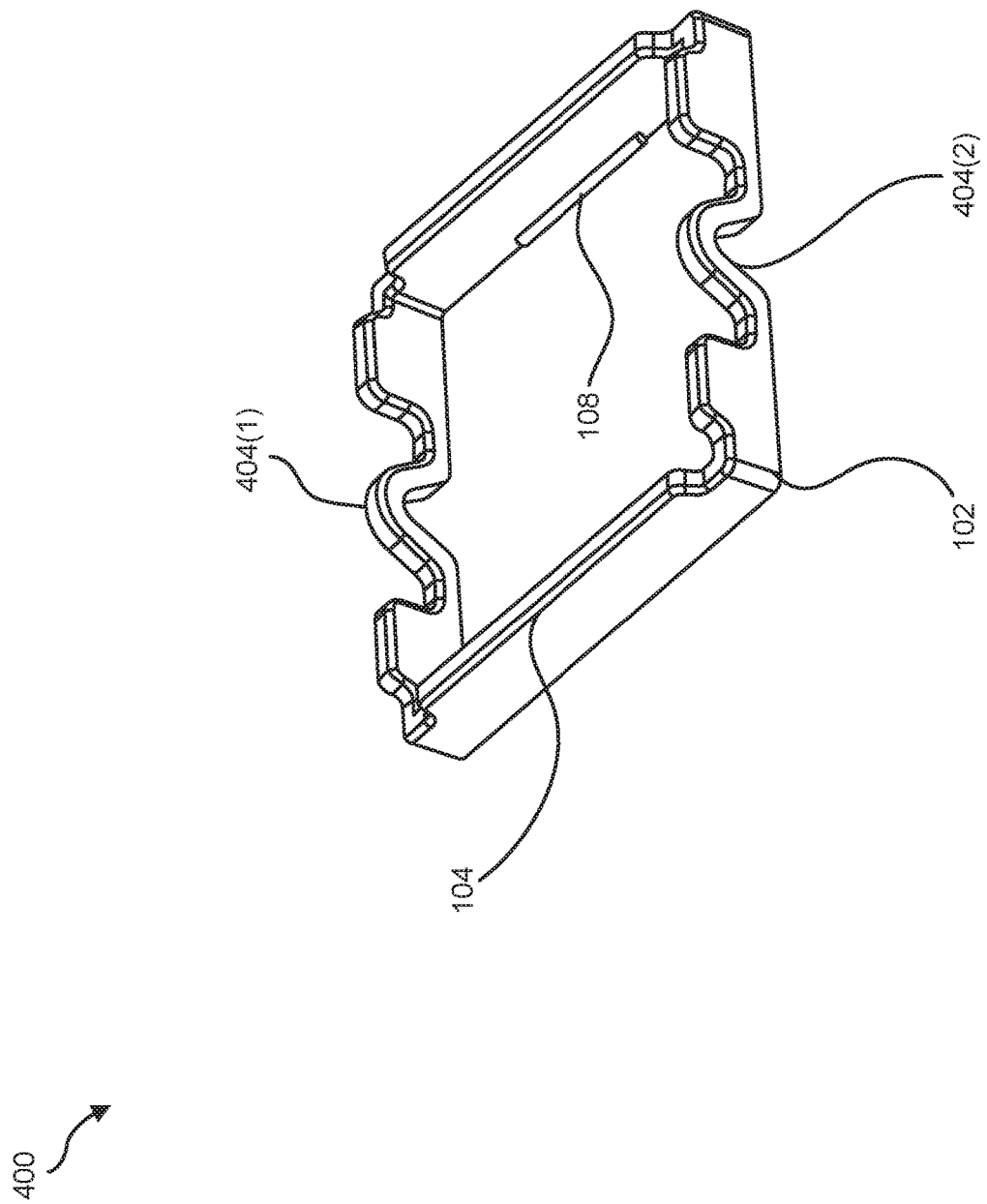
FIG. 4 is an illustration of an additional exemplary interference-fit frame for retaining TIM between electrical components and heatsinks.

FIG. 4 illustrates an exemplary interference-fit frame 400 for retaining TIM between electrical components and heatsinks. As illustrated in FIG. 4, exemplary interference-fit frame 400 may include and/or represent a border 102 dimensioned for installation around an electrical component coupled to a circuit board. In one example, border 102 may form an opening 106 in which the electrical component resides when border 102 is installed. In this example, at least a portion of border 102 may constitute and/or represent a retention dam 104 that rises beyond the electrical component when border 102 is installed. Interference-fit frame 400 may also include and/or represent at least one protuberance 108 that extends from border 102 into opening 106.

As illustrated in FIG. 4, interference-fit frame 400 may include one or more flex features that enable border 102 to flexibly mount around the electrical component. In some examples, border 102 may include and/or incorporate one or more creases, crimps, bellows, and/or accordion-like mechanisms formed within at least one of the sides. For example, border 102 may include and/or incorporate flex creases 404(1) and 404(2) incorporated into opposing sides. In this example, flex creases 404(1) and 404(2) may enable border 102 to flex, bend, and/or arch to fit or conform to the electrical component.

Figure 5:
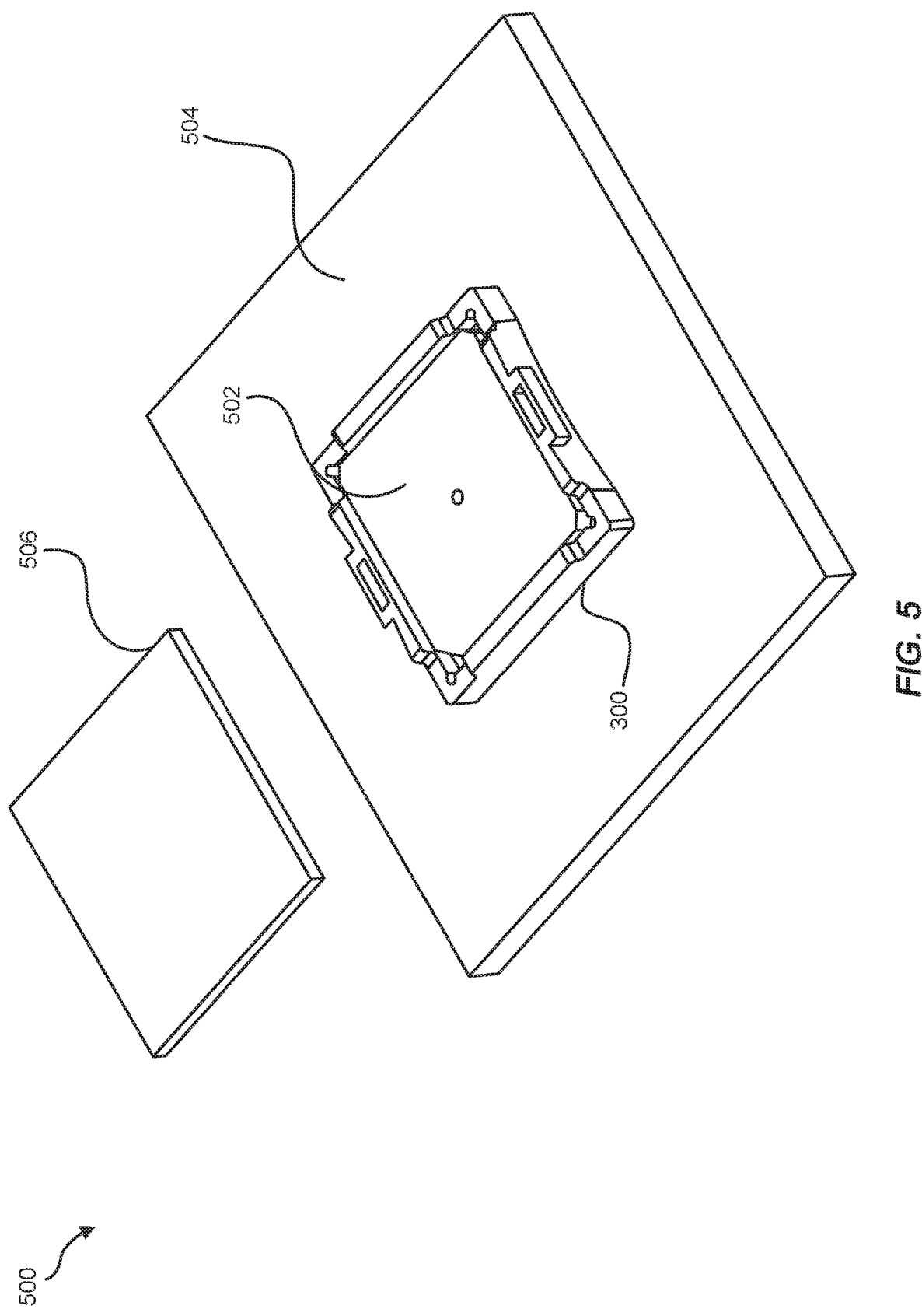
FIG. 5 is an illustration of an exemplary system for retaining TIM between electrical components and heatsinks.

FIG. 5 illustrates an exemplary system 500 for retaining TIM between electrical components and heatsinks. As illustrated in FIG. 5, exemplary system 500 may include and/or represent interference-fit frame 300, a heatsink 506, and an electrical component 502 coupled to a circuit board 504. In one example, interference-fit frame 300 may include border 102 that forms an opening in which electrical component 502 resides when border 102 is installed. In this example, after the installation of border 102, TIM may be installed, applied, and/or placed atop electrical component 502. Heatsink 506 may then be installed, applied, and/or placed over electrical component 502 such that the TIM resides between heatsink 506 and electrical component 502.

In some examples, because interference-fit frame 300 is mounted and/or installed around electrical component 502, interference-fit frame 300 may be able to retain, contain, and/or maintain the TIM in place between heatsink 506 and electrical component 502. In other words, interference-fit frame 300 may prevent the TIM from leaking out from between heatsink 506 and electrical component 502.

In some examples, electrical component 502 may include and/or represent any type or form of component, device, and/or circuit that emits or generates heat. Examples of electrical component 502 include, without limitation, Application-Specific Integrated Circuits (ASICs), Systems on a Chip (SoCs), Central Processing Units (CPUs), microprocessors, microcontrollers, Field-Programmable Gate Arrays (FPGAs) that implement softcore processors, integrated circuits, portions of one or more of the same, variations or combinations of one or more of the same, and/or any other suitable electrical component.

In some examples, heatsink 506 may include and/or represent any type or form of system, device, structure, and/or mechanism that conducts, transfers, absorbs, and/or sinks heat. Heatsink 506 may include and/or contain a variety of materials. Examples of such heatsink materials include, without limitation, copper, aluminum, diamond, alloys of one or more of the same, combinations or variations of one or more of the same, and/or any other suitable materials.

Figure 6:
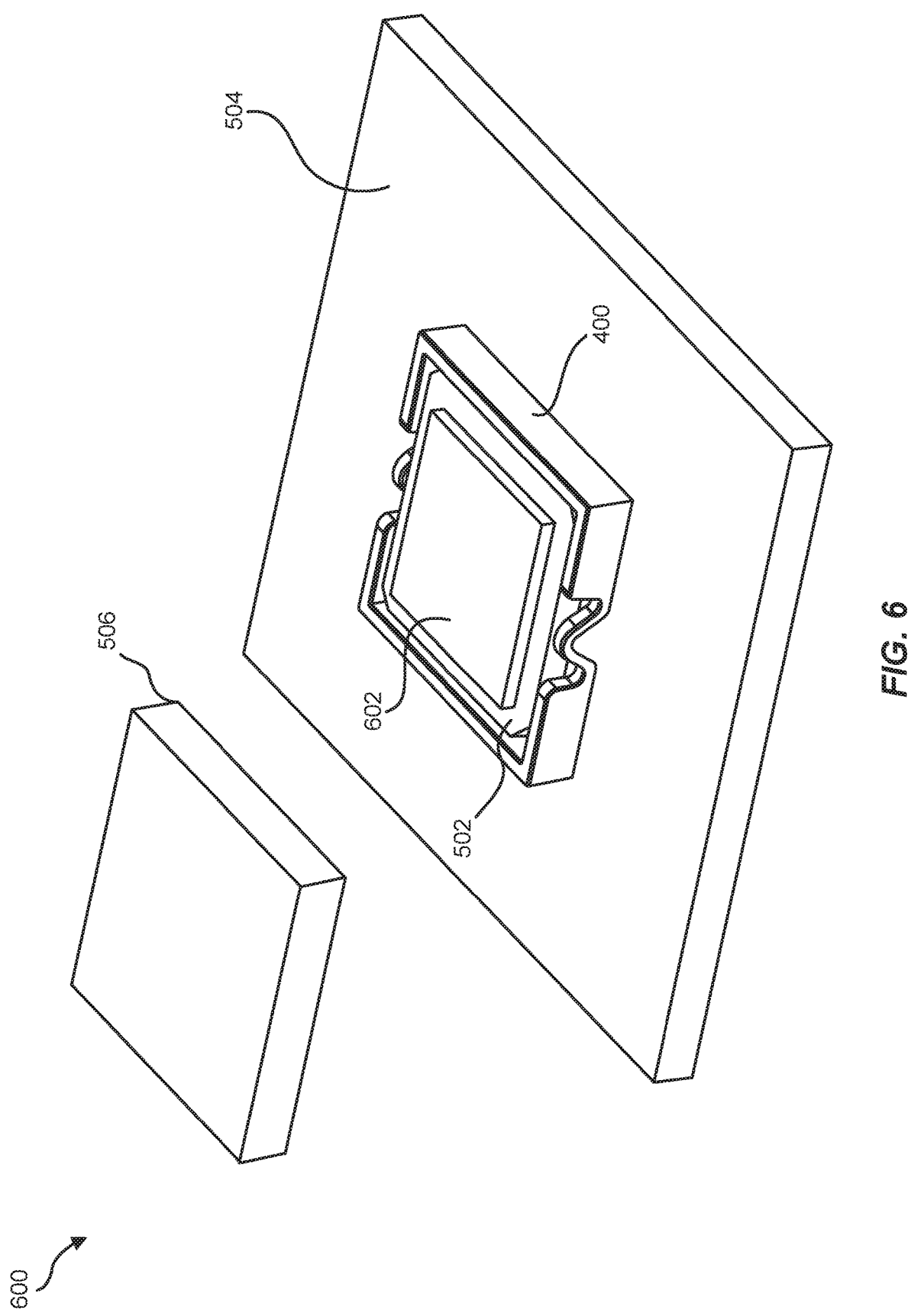
FIG. 6 is an illustration of an additional exemplary system for retaining TIM between electrical components and heatsinks.
Figure 7:
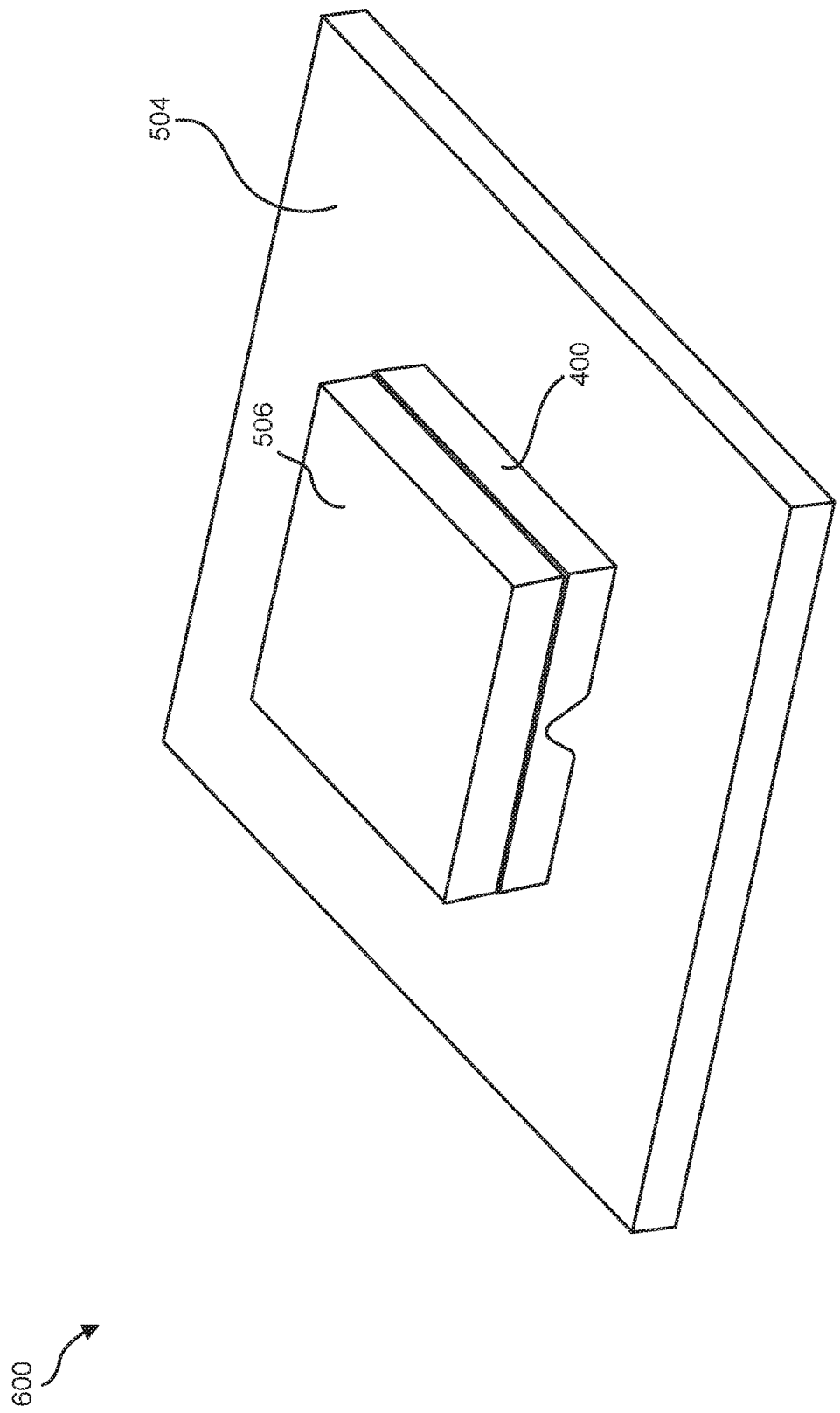
FIG. 7 is an illustration of an additional exemplary system for retaining TIM between electrical components and heatsinks.

FIGS. 6 and 7 illustrates exemplary systems 600 and 700 for retaining TIM between electrical components and heatsinks. As illustrated in FIG. 6, exemplary system 600 may include and/or represent interference-fit frame 400, heatsink 506, electrical component 502 coupled to circuit board 504, and a TIM 602. In one example, interference-fit frame 400 may include border 102 that forms an opening in which electrical component 502 resides when border 102 is installed. In this example, after the installation of border 102, TIM 602 may be installed, applied, and/or placed atop electrical component 502. As illustrated in FIG. 7, heatsink 506 may then be installed, applied, and/or placed over electrical component 502 such that TIM 602 resides between heatsink 506 and electrical component 502.

In some examples, TIM 602 may include and/or represent any type or form of material that facilitates the transfer of heat from one component and/or device to another. In one example, TIM 602 may include and/or represent a gap-filling putty that facilitates and/or supports thermal transfer. Additional examples of TIM 602 include, without limitation, thermal interface greases, gels, putties, pastes, phase-change materials, adhesives, potting compounds, expanders, combinations or variations of one or more of the same, and/or any other suitable TIM.

Figure 8:
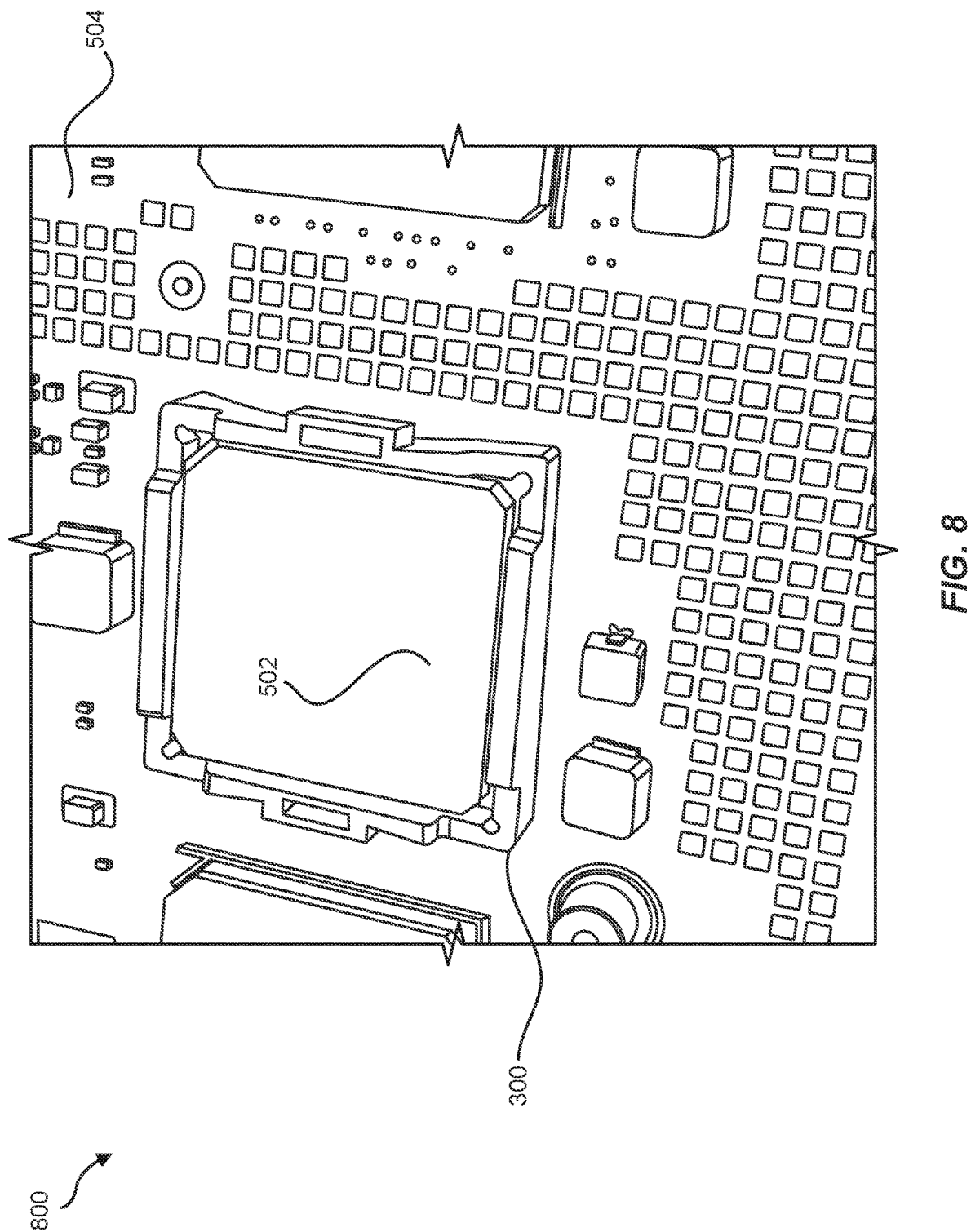
FIG. 8 is an illustration of an additional exemplary system for retaining TIM between electrical components and heatsinks.

FIG. 8 illustrates an exemplary system 800 for retaining TIM between electrical components and heatsinks. As illustrated in FIG. 8, exemplary system 800 may include and/or represent interference-fit frame 300 mounted and/or installed around electrical component 502 coupled to circuit board 504. In one example, interference-fit frame 300 may include border 102 that forms an opening in which electrical component 502 resides. In this example, after the installation of border 102, TIM may be installed, applied, and/or placed atop electrical component 502. A heatsink may then be installed, applied, and/or placed over electrical component 502 such that the TIM resides between the heatsink and electrical component 502.

Figure 9:
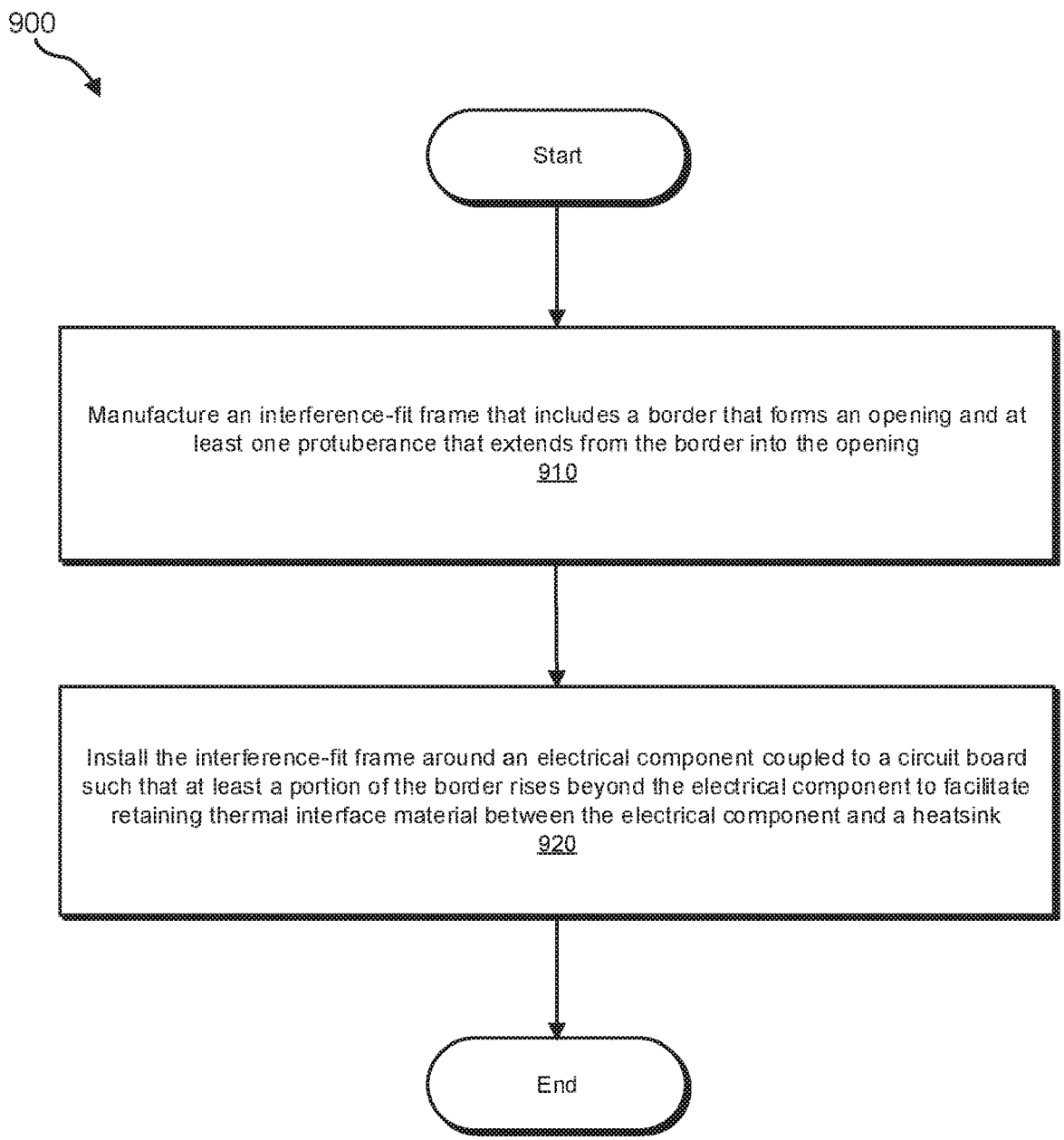
FIG. 9 is a flow diagram of an exemplary method for retaining TIM between electrical components and heatsinks.

FIG. 9 is a flow diagram of an exemplary method 900 for retaining TIM between electrical components and heatsinks. Method 900 may include the step of manufacture an interference-fit frame that includes a border (910). Step 910 may be performed in a variety of ways, including any of those described above in connection with FIGS. 1-8. For example, a computing equipment manufacturer or subcontractor may manufacture an interference-fit frame that includes a border that forms an opening and at least one protuberance that extends from the border into the opening. In this example, the protuberance may help secure the interference-fit frame to an electrical component that fits within the opening.

Method 900 may also include the step of installing the interference-fit frame around an electrical component coupled to a circuit board such that at least a portion of the border rises beyond the electrical component to facilitate retaining TIM between the electrical component and a heatsink (920). Step 920 may be performed in a variety of ways, including any of those described above in connection with FIGS. 1-8. For example, the computing equipment manufacturer or subcontractor may install the interference-fit frame around an electrical component coupled to a circuit board. In this example, the computing equipment manufacturer or subcontractor may install, apply, and/or place TIM and a heatsink atop the electrical component. Upon doing so, the interference-fit frame may be able to retain the TIM in place between the electrical component and the heatsink, thereby preventing the TIM from leaking out and/or ruining the thermal coupling.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An interference-fit frame comprising:
    a border dimensioned for installation around an electrical component coupled to a circuit board, wherein:
        the border forms an opening in which the electrical component resides when the border is installed;
        the border comprises a plurality of sides that collectively facilitate securing the border to the electrical component by friction; and
        at least a portion of the border constitutes a retention dam that rises beyond the electrical component when the border is installed; and
    a plurality of protuberances that:
        extend between at least some of the sides and the electrical component; and
        make physical contact with the electrical component, wherein at least one of the protuberances extends from the border into the opening.

2. The interference-fit frame of claim 1, wherein at least one of the sides of the border forms at least one trench dimensioned to accept a tool for uninstalling the border from the electrical component.

3. The interference-fit frame of claim 1, wherein at least one of the sides of the border incorporates at least one flex feature that enables the border to flexibly mount around the electrical component.

4. The interference-fit frame of claim 3, wherein the flex feature comprises at least one pocket of empty space formed within the at least one of the sides of the border.

5. The interference-fit frame of claim 3, wherein the flex feature comprises at least one flexible crease formed within the at least one of the sides of the border.

6. The interference-fit frame of claim 1, wherein the border and the plurality of protuberances are formed as a single unit.

7. The interference-fit frame of claim 6, wherein the single unit is a piece of injection molding.

8. The interference-fit frame of claim 1, wherein the retention dam retains thermal interface material between the electrical component and a heatsink.

9. The interference-fit frame of claim 1, wherein a height of the border is greater than a height of the electrical component.

10. A system comprising:
    an electrical component coupled to a circuit board; and
    an interference-fit frame comprising:
        a border dimensioned for installation around the electrical component coupled to the circuit board, wherein:
            the border forms an opening in which the electrical component resides when the border is installed;
            the border comprises a plurality of sides that collectively facilitate securing the border to the electrical component by friction; and
            at least a portion of the border constitutes a retention dam that rises beyond the electrical component when the border is installed; and
        a plurality of protuberances that:
            extend between at least some of the sides and the electrical component; and
            make physical contact with the electrical component, wherein at least one of the protuberances extends from the border into the opening.

11. The system of claim 10, wherein at least one of the sides of the border forms at least one trench dimensioned to accept a tool for uninstalling the border from the electrical component.

12. The system of claim 10, wherein at least one of the sides of the border incorporates at least one flex feature that enables the border to flexibly mount around the electrical component.

13. The system of claim 12, wherein the flex feature comprises at least one pocket of empty space formed within the at least one of the sides of the border.

14. The system of claim 12, wherein the flex feature comprises at least one flexible crease formed within the at least one of the sides of the border.

15. The system of claim 10, wherein the border and the plurality of protuberances are formed as a single unit.

16. The system of claim 15, wherein the single unit is a piece of injection molding.

17. The system of claim 10, wherein the retention dam retains thermal interface material between the electrical component and a heatsink.

18. A method comprising:
    manufacturing an interference-fit frame that includes:
        a border that forms an opening and comprises a plurality of sides; and
        a plurality of protuberances that:
            extend between at least some of the sides and an electrical component coupled to a circuit board; and
            make physical contact with the electrical component, wherein at least one of the protuberances extends from the border into the opening; and
    installing the interference-fit frame around the electrical component coupled to the circuit board such that;
        at least a portion of the border rises beyond the electrical component to facilitate retaining thermal interface material between the electrical component and a heatsink; and
        the plurality of sides collectively facilitate securing the border to the electrical component by friction.

* * * * *